(12) United States Patent
Sharma et al.

(10) Patent No.: US 10,439,558 B2
(45) Date of Patent: Oct. 8, 2019

(54) APPARATUS AND METHODS FOR POWER AMPLIFIERS WITH POSITIVE ENVELOPE FEEDBACK

(71) Applicant: SKYWORKS SOLUTIONS, INC., Woburn, MA (US)

(72) Inventors: Smarjeet Sharma, Montreal (CA); Nicolas Gerard Constantin, Notre-Dame-de-l'Ile-Perrot (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/956,443

(22) Filed: Apr. 18, 2018

(65) Prior Publication Data

US 2018/0316312 A1 Nov. 1, 2018

Related U.S. Application Data

(60) Provisional application No. 62/491,886, filed on Apr. 28, 2017.

(51) Int. Cl.
*H03G 3/20* (2006.01)
*H03F 1/02* (2006.01)
(Continued)

(52) U.S. Cl.
CPC ......... *H03F 1/0227* (2013.01); *H03F 1/0238* (2013.01); *H03F 3/193* (2013.01);
(Continued)

(58) Field of Classification Search
CPC .................................. H03G 3/20; H03F 1/30
(Continued)

(56) References Cited

U.S. PATENT DOCUMENTS

| 4,124,825 A | * | 11/1978 | Webb | H03G 3/3084 330/279 |
| 4,435,846 A | * | 3/1984 | Weise | H03G 3/3052 330/129 |

(Continued)

OTHER PUBLICATIONS

Kim et al., "Analysis of Envelope-Tracking Power Amplifier Using Mathematical Modeling," in IEEE Transactions on Microwave Theory and Techniques, vol. 62, No. 6, pp. 1352-1362, Jun. 2014.

(Continued)

*Primary Examiner* — Henry Choe
(74) *Attorney, Agent, or Firm* — Knobbe Martens Olson & Bear LLP

(57) ABSTRACT

Apparatus and methods for power amplifiers with positive envelope feedback are provided herein. In certain implementations, a power amplifier system includes a power amplification stage that amplifies a radio frequency signal, at least one envelope detector that generates one or more detection signals indicating an output signal envelope of the power amplification stage, and a wideband feedback circuit that provides positive envelope feedback to a bias of the power amplification stage based on the one or more detection signals. The power amplifier system further includes a supply modulator that controls a voltage level of a supply voltage of the power amplification stage based on the one or more detection signals such that the supply voltage is modulated with the output signal envelope through positive envelope feedback.

20 Claims, 16 Drawing Sheets

(51) Int. Cl.
   *H03F 3/193* (2006.01)
   *H03F 3/68* (2006.01)
   *H03F 3/24* (2006.01)
   *H03F 3/21* (2006.01)
   *H03F 3/195* (2006.01)

(52) U.S. Cl.
   CPC ............. *H03F 3/195* (2013.01); *H03F 3/211* (2013.01); *H03F 3/245* (2013.01); *H03F 3/68* (2013.01); *H03F 2200/102* (2013.01); *H03F 2200/321* (2013.01); *H03F 2200/411* (2013.01); *H03F 2200/451* (2013.01)

(58) Field of Classification Search
   USPC .................................. 330/136, 297, 296, 285
   See application file for complete search history.

(56) References Cited

U.S. PATENT DOCUMENTS

| | | | | |
|---|---|---|---|---|
| 4,540,953 | A * | 9/1985 | Togari | H03G 1/0082 330/279 |
| 5,179,353 | A * | 1/1993 | Miyake | H03G 3/3042 330/129 |
| 5,381,115 | A * | 1/1995 | Timmons | H03G 1/04 330/129 |
| 6,057,735 | A * | 5/2000 | Cloutier | H03G 1/007 330/107 |
| 6,137,354 | A | 10/2000 | Dacus et al. | |
| 6,982,594 | B2 * | 1/2006 | Snider | H03G 3/3047 330/129 |
| 7,091,777 | B2 | 8/2006 | Lynch | |
| 7,372,333 | B2 | 5/2008 | Abedinpour et al. | |
| 7,405,617 | B2 | 7/2008 | Constantin | |
| 7,421,254 | B2 | 9/2008 | Behzad | |
| 8,598,950 | B2 | 12/2013 | Khesbak | |
| 8,718,188 | B2 | 5/2014 | Balteanu et al. | |
| 8,797,103 | B2 | 8/2014 | Kaczman et al. | |
| 8,928,403 | B2 * | 1/2015 | Bartram | H03F 1/0222 330/136 |
| 8,981,847 | B2 | 3/2015 | Balteanu | |
| 8,989,682 | B2 | 3/2015 | Ripley et al. | |
| 9,413,303 | B2 | 8/2016 | Mostov et al. | |
| 9,445,371 | B2 | 9/2016 | Khesbak et al. | |
| 2004/0056720 | A1 * | 3/2004 | Jansen | H03G 3/3042 330/279 |
| 2013/0231069 | A1 * | 9/2013 | Drogi | H04B 1/0475 455/114.3 |
| 2016/0380602 | A1 * | 12/2016 | Zampardi, Jr. | H03F 3/19 330/300 |
| 2017/0195972 | A1 | 7/2017 | Drogi et al. | |
| 2018/0076772 | A1 | 3/2018 | Khesbak et al. | |
| 2018/0198424 | A1 | 7/2018 | Sharma et al. | |

OTHER PUBLICATIONS

Kim et al., "Envelope-Tracking Two-Stage Power Amplifier With Dual-Mode Supply Modulator for LTE Applications," in IEEE Transactions on Microwave Theory and Techniques, vol. 61, No. 1, pp. 543-552, Jan. 2013.

Li et al., "Design of High Efficiency Monolithic Power Amplifier With Envelope-Tracking and Transistor Resizing for Broadband Wireless Applications," in IEEE Journal of Solid-State Circuits, vol. 47, No. 9, pp. 2007-2018, Sep. 2012.

Moon et al., "Investigation of Intermodulation Distortion of Envelope Tracking Power Amplifier for Linearity Improvement," in IEEE Transactions on Microwave Theory and Techniques, vol. 63, No. 4, pp. 1324-1333, Apr. 2015.

Sharma et al., "Positive Envelope Feedback for Linearity Improvement in RFIC Pas," IEEE, date of conference Apr. 19-20, 2017, in 5 pages.

Zohny et al., "A comparison of state-of-the-art efficiency enhancement techniques of fully integrated CMOS power amplifiers for handset LTE applications," in Wireless and Microwave Technology Conference (WAMICON), 2013 IEEE 14th Annual. (Apr. 2013), p. 1-4.

\* cited by examiner

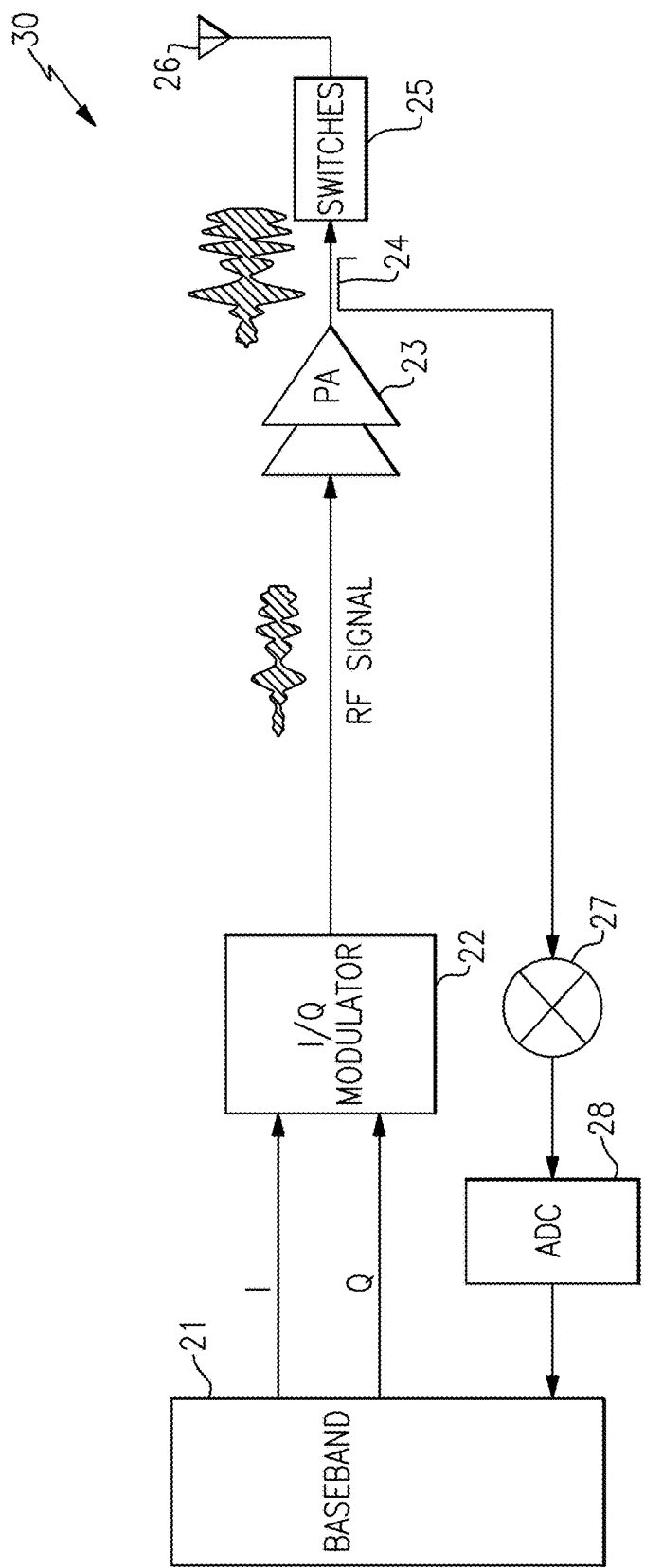

APPARATUS AND METHODS FOR POWER AMPLIFIERS WITH POSITIVE ENVELOPE FEEDBACK

CROSS-REFERENCE TO RELATED APPLICATIONS

This application claims the benefit of priority under 35 U.S.C. § 119 of U.S. Provisional Patent Application No. 62/491,886, filed Apr. 28, 2017 and titled "APPARATUS AND METHODS FOR POWER AMPLIFIERS WITH POSITIVE ENVELOPE FEEDBACK," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to, mobile phones, tablets, base stations, network access points, laptops, and wearable electronics. For example, in mobile devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 450 MHz to about 6 GHz for certain communications standards.

SUMMARY

In certain embodiments, the present disclosure relates to a power amplifier system. The power amplifier system includes a power amplification stage configured to amplify a radio frequency signal, at least one output envelope detector configured to generate one or more detection signals indicating an output signal envelope of the power amplification stage, a feedback circuit configured to provide positive envelope feedback to a bias of the power amplification stage based on the one or more detection signals, and a supply modulator configured to control a voltage level of a supply voltage of the power amplification stage based on the one or more detection signals such that the supply voltage is modulated with the output signal envelope through positive envelope feedback.

In various embodiments, the at least one output envelope detector includes a current mode detector electrically coupled to an output of the power amplification stage.

In several embodiments, the feedback circuit includes a wideband voltage shifter. In accordance with a number of embodiments, the wideband voltage shifter includes a first resistor including a first end configured to receive a first detection signal of the one or more detection signals and a second end configured to generate a positive envelope feedback signal operable to control the bias of the power amplification stage. According to various embodiments, the wideband voltage shifter further includes a voltage source and a second resistor electrically connected between the second end of the first resistor and the voltage source, the first resistor and the second resistor configured to operate as a voltage divider. In accordance with several embodiments, the voltage source is operable to control a quiescent bias voltage of the power amplification stage.

In some embodiments, the power amplification stage includes a field-effect transistor configured to amplify the radio frequency signal, the feedback circuit configured to provide positive envelope feedback to a gate of the field-effect transistor based on the one or more detection signals. In accordance with a number of embodiments, the feedback circuit includes an output configured to generate a positive envelope feedback signal based on the detection signal, the power amplifier system further including a bias choke inductor electrically connected between the output of the feedback circuit and the gate of the field-effect transistor. According to several embodiments, the supply modulator includes an output configured to generate the supply voltage, the power amplification stage further including a supply choke inductor electrically connected between the output of the supply modulator and a drain of the field-effect transistor.

In several embodiments, the power amplification stage includes a bipolar transistor configured to amplify the radio frequency signal, the feedback circuit configured to provide positive envelope feedback to a base of the bipolar transistor based on the detection signal. According to some embodiments, the feedback circuit includes an output configured to generate a positive envelope feedback signal based on the detection signal, the power amplifier system further including a bias choke inductor electrically connected between the output of the feedback circuit and the base of the bipolar transistor. In accordance with a number of embodiments, the supply modulator includes an output configured to generate the supply voltage, the power amplification stage further including a supply choke inductor electrically connected between the output of the supply modulator and a collector of the bipolar transistor.

In some embodiments, the power amplification stage is an output stage, the power amplifier system further including an input stage configured to provide the radio frequency signal to the output stage. According to several embodiments, the power amplifier system further including an input stage envelope detector configured to generate a input stage detection signal indicating an output signal envelope of the input stage, an input stage feedback circuit configured to provide positive envelope feedback to a bias of the input stage based on the input stage detection signal, and an input stage supply modulator configured to control a voltage level of an input stage supply voltage of the input stage based on the detection signal through positive envelope feedback.

In various embodiments, the supply modulator is further configured to receive a conditioning signal, and to control the supply voltage based on the conditioning signal. According to a number of embodiments, the conditioning signal provides a coarse adjustment to the supply voltage and the one or more detection signals provides a fine adjustment to the supply voltage. In accordance with several embodiments, the supply modulator includes a DC-to-DC converter configured to receive a battery voltage and to output the supply voltage, the DC-to-DC converter controlled based on the conditioning signal and the one or more detection signals. According to some embodiments, the conditioning signal is generated by an input envelope detector. In accordance with a number of embodiments, the condition signal is generated by an inter-stage envelope detector. According to several embodiments, the conditioning signal is generated by a baseband processor.

In certain embodiments, the present disclosure relates to a packaged module including a package substrate, a first die attached to the package substrate, and a second die attached to the package substrate. The first die includes a power amplification stage configured to amplify a radio frequency signal, at least one output envelope detector configured to generate one or more detection signals indicating an output signal envelope of the power amplification stage, and a feedback circuit configured to provide positive envelope feedback to a bias of the power amplification stage based on the one or more detection signals. The second die includes a supply modulator configured to control a voltage level of a supply voltage of the power amplification stage based on the one or more detection signals such that the supply voltage is modulated with the output signal envelope through positive envelope feedback.

In some embodiments, the at least one output envelope detector includes a current mode detector electrically coupled to an output of the power amplification stage.

In several embodiments, the feedback circuit includes a wideband voltage shifter. According to a number of embodiments, the wideband voltage shifter includes a first resistor including a first end configured to receive a first detection signal of the one or more detection signals and a second end configured to generate a positive envelope feedback signal operable to control the bias of the power amplification stage. In accordance with various embodiments, the wideband voltage shifter further includes a voltage source and a second resistor electrically connected between the second end of the first resistor and the voltage source, the first resistor and the second resistor configured to operate as a voltage divider. According to some embodiments, the voltage source is operable to control a quiescent bias voltage of the power amplification stage.

In various embodiments, the power amplification stage includes a field-effect transistor configured to amplify the radio frequency signal, the feedback circuit configured to provide positive envelope feedback to a gate of the field-effect transistor based on the one or more detection signals. In accordance with a number of embodiments, the feedback circuit includes an output configured to generate a positive envelope feedback signal based on the detection signal, the power amplifier system further including a bias choke inductor attached to the package substrate and electrically connected between the output of the feedback circuit and the gate of the field-effect transistor. According to several embodiments, the supply modulator includes an output configured to generate the supply voltage, the power amplification stage further including a supply choke inductor attached to the package substrate and electrically connected between the output of the supply modulator and a drain of the field-effect transistor.

In several embodiments, the power amplification stage includes a bipolar transistor configured to amplify the radio frequency signal, the feedback circuit configured to provide positive envelope feedback to a base of the bipolar transistor based on the detection signal. According to some embodiments, the feedback circuit includes an output configured to generate a positive envelope feedback signal based on the detection signal, the power amplifier system further including a bias choke inductor attached to the package substrate and electrically connected between the output of the feedback circuit and the base of the bipolar transistor. In accordance with a number of embodiments, the supply modulator includes an output configured to generate the supply voltage, the power amplification stage further including a supply choke inductor attached to the package substrate and electrically connected between the output of the supply modulator and a collector of the bipolar transistor.

In various embodiments, the power amplification stage is an output stage, the first die further including an input stage configured to provide the radio frequency signal to the output stage. According to several embodiments, the first die further including an input stage envelope detector configured to generate a input stage detection signal indicating an output signal envelope of the input stage, and an input stage feedback circuit configured to provide positive envelope feedback to a bias of the input stage based on the input stage detection signal. In accordance with a number of embodiments, the second die further includes an input stage supply modulator configured to control a voltage level of an input stage supply voltage of the input stage based on the detection signal through positive envelope feedback.

In some embodiments, the supply modulator is further configured to receive a conditioning signal, and to control the supply voltage based on the conditioning signal. According to various embodiments, the conditioning signal provides a coarse adjustment to the supply voltage and the one or more detection signals provides a fine adjustment to the supply voltage. In accordance with several embodiments, the supply modulator includes a DC-to-DC converter configured to receive a battery voltage and to output the supply voltage, the DC-to-DC converter controlled based on the conditioning signal and the one or more detection signals. According to some embodiments, the conditioning signal is generated by an input envelope detector. In accordance with a number of embodiments, the condition signal is generated by an inter-stage envelope detector. According to several embodiments, the conditioning signal is generated by a baseband processor.

In certain embodiments, the present disclosure relates to a method of amplification in a power amplifier system. The method includes amplifying a radio frequency signal using a power amplification stage, generating one or more detection signals indicating an output signal envelope of the power amplification stage using at least one output envelope detector, providing positive envelope feedback to a bias of the power amplification stage based on the one or more detection signals using a feedback circuit, and controlling a voltage level of a supply voltage of the power amplification stage based on the one or more detection signals using a supply modulator so as to modulate the supply voltage with the output signal envelope through positive envelope feedback.

In various embodiments, providing positive envelope feedback to the bias of the power amplification stage includes controlling a gate bias of a field effect transistor of the power amplification stage.

In a number of embodiments, providing positive envelope feedback to the bias of the power amplification stage includes controlling a base bias of a bipolar transistor of the power amplification stage.

In several embodiments, generating the one or more detection signals includes extracting the output signal envelope from an output of the power amplification stage using a current mode detector.

In some embodiments, controlling the voltage level of the supply voltage comprises providing a coarse adjustment to the voltage level based on a conditioning signal and providing a fine adjustment to the voltage level based on the one or more detection signals.

BRIEF DESCRIPTION OF THE DRAWINGS

FIG. 2 is a schematic diagram of one embodiment of a power amplifier system.

DETAILED DESCRIPTION OF EMBODIMENTS

Figure 1:
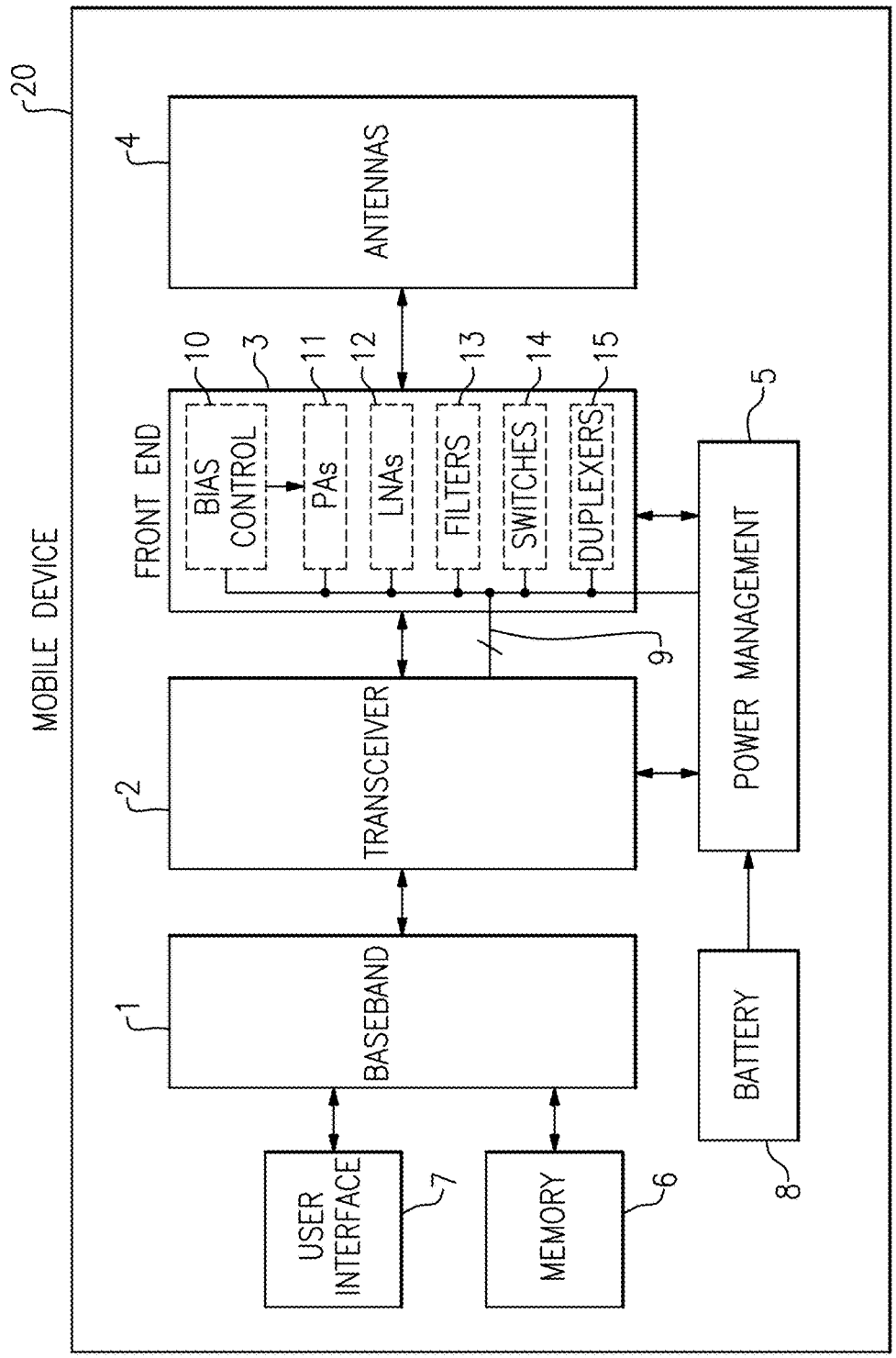
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A power amplifier can suffer from a trade-off between efficiency and linearity. Additionally, the efficiency and linearity trade-off can vary across a range of power levels of the power amplifier, and can be constrained with respect to available chip area, limitations on current consumption, and/or constraints on implementation complexity.

Moreover, a modulation scheme used for radio frequency (RF) signals amplified by the power amplifier can impact the power amplifier's efficiency and linearity performance.

For example, certain power amplifiers provide amplification to RF signals that are modulated using relatively complex modulation formats, such as high-level quadrature amplitude modulation (QAM), which can exhibit a relatively high peak to average power ratio (PAPR). Thus, although a power amplifier may be transmitting at a particular level of average power, an actual or instantaneous power level of the power amplifier can be several decibels (dBs) higher than the average power level. The instantaneous power level can vary based on an envelope frequency used for the modulated signal.

Apparatus and methods for power amplifiers with positive envelope feedback are provided herein. In certain implementations, a power amplifier system includes a power amplification stage that amplifies a radio frequency signal, at least one envelope detector that generates one or more detection signals indicating an output signal envelope of the power amplification stage, and a wideband feedback circuit that provides positive envelope feedback to a bias of the power amplification stage based on the one or more detection signals. The power amplifier system further includes a supply modulator that controls a voltage level of a supply voltage of the power amplification stage based on the one or more detection signals such that the supply voltage is modulated with the output signal envelope through positive envelope feedback.

Accordingly, the output signal envelope of the power amplifier is used to provide positive envelope feedback that modifies both the bias and the supply voltage of the power amplification stage.

Providing positive envelope feedback in this manner can provide a number of advantages, such as enhanced linearity and/or efficiency. For example, the power amplifier systems herein can operate with superior combined linearity and efficiency over a range of power levels.

Embodiments of power amplifier systems using positive envelope feedback as provided herein operate distinctly and differently from power amplifier systems using negative envelope feedback.

The teachings herein are applicable to a wide variety of power amplifier systems, including power amplifier systems that provide amplification to RF signals associated with complex modulation formats and high PAPR waveforms.

In certain implementations, the power amplifier system is implemented using a single multi-chip module (MCM), which can provide a relatively compact solution. In contrast, certain power amplifier systems that operate with envelope tracking are implemented using a power amplifier module and a separate envelope tracker module.

Moreover, using output signal envelope to provide feedback can also provide a number of advantages relative to implementations using an input signal envelope to control supply voltage. For example, implementing the power amplifier in this manner can reduce complexity relative to configurations using an envelope tracker, which can use relatively complex digital signal processing (DSP) elements and/or complex analog circuitry for envelope shaping and/or phase compensation. Furthermore, using positive envelope feedback provides a number of advantages, including, but not limited to higher combined linearity and efficiency.

FIG. 1 is a schematic diagram of one embodiment of a mobile device 20. The mobile device 20 includes a baseband system 1, a transceiver 2, a front end system 3, antennas 4, a power management system 5, a memory 6, a user interface 7, and a battery 8.

Although the mobile device 20 illustrates one example of an RF system that can include one or more features of the present disclosure, the teachings herein are applicable to electronic systems implemented in a wide variety of ways.

The mobile device 20 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 2 generates RF signals for transmission and processes incoming RF signals received from the antennas 4. It will be understood that various functionalities associated with the transmission and receiving of RF signals can be achieved by one or more components that are collectively represented in FIG. 1 as the transceiver 2. In one example, separate components (for instance, separate circuits or dies) can be provided for handling certain types of RF signals.

As shown in in FIG. 1, the transceiver 2 is connected to the front end system 3 and to the power management circuit 5 using a serial interface 9. All or part of the illustrated RF components can be controlled by the serial interface 9 to configure the mobile device 20 during initialization and/or while fully operational. In another embodiment, the baseband system 1 is additionally or alternative connected to the serial interface 9 and operates to configure one or more RF components, such as components of the front end system 3 and/or power management system 5.

The front end system 3 aids is conditioning signals transmitted to and/or received from the antennas 4. In the illustrated embodiment, the front end system 3 includes one or more bias control circuits 10 for controlling power amplifier biasing, one or more power amplifiers (PAs) 11, one or more low noise amplifiers (LNAs) 12, one or more filters 13, one or more switches 14, and one or more duplexers 15. However, other implementations are possible.

For example, the front end system 3 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 20 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 4 can include antennas used for a wide variety of types of communications. For example, the antennas 4 can include antennas for transmitting and/or receiving signals associated with a wide variety of frequencies and communications standards.

In certain implementations, the antennas 4 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 20 can operate with beamforming in certain implementations. For example, the front end system 3 can include phase shifters having variable phase controlled by the transceiver 2. Additionally, the phase shifters are controlled to provide beam formation and directivity for transmission and/or reception of signals using the antennas 4. For example, in the context of signal transmission, the phases of the transmit signals provided to the antennas 4 are controlled such that radiated signals from the antennas 4 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 4 from a particular direction. In certain implementations, the antennas 4 include one or more arrays of antenna elements to enhance beamforming.

The baseband system 1 is coupled to the user interface 7 to facilitate processing of various user input and output (I/O), such as voice and data. The baseband system 1 provides the transceiver 2 with digital representations of transmit signals, which the transceiver 2 processes to generate RF signals for transmission. The baseband system 1 also processes digital representations of received signals provided by the transceiver 2. As shown in FIG. 1, the baseband system 1 is coupled to the memory 6 of facilitate operation of the mobile device 20.

The memory 6 can be used for a wide variety of purposes, such as storing data and/or instructions to facilitate the operation of the mobile device 20 and/or to provide storage of user information.

The power management system 5 provides a number of power management functions of the mobile device 20. In certain implementations, the power management system 5 includes a power amplifier (PA) supply control circuit that controls the supply voltages of the power amplifiers 11. In the illustrated embodiment, the power management system 5 is configurable using the serial interface 9.

As shown in FIG. 1, the power management system 5 receives a battery voltage from the battery 8. The battery 8 can be any suitable battery for use in the mobile device 20, including, for example, a lithium-ion battery. Although the power management system 5 is illustrated as separate from the front end system 3, in certain implementations all or part (for instance, a PA supply modulator) of the power management system 5 is integrated into the front end system 3.

FIG. 2 is a schematic block diagram of one example of a power amplifier system 30. The illustrated power amplifier system 30 includes a baseband processor 21, an I/Q modulator 22, a power amplifier 23, a directional coupler 24, switches 25, an antenna 26, a mixer 27, and an analog-to-digital converter (ADC) 28.

The baseband signal processor 21 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 22 in a digital format. The baseband processor 21 can be any suitable processor configured to process baseband signals. For instance, the baseband processor 21 can include a digital signal processor, a microprocessor, a programmable core, or any combination thereof. Moreover, in some implementations, two or more baseband processors 21 can be included in the power amplifier system 30.

The I/Q modulator 22 can be configured to receive the I and Q signals from the baseband processor 21 and to process the I and Q signals to generate an RF signal. For example, the I/Q modulator 22 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 23. In certain implementations, the I/Q modulator 22 can include one or more filters configured to filter frequency content of signals processed therein.

The power amplifier 23 can receive the RF signal from the I/Q modulator 22, and when enabled can provide an amplified RF signal to the antenna 26 via the switches 25. The directional coupler 24 can be positioned between the output of the power amplifier 23 and the input of the switches 25, thereby allowing an output power measurement of the power amplifier 23 that does not include insertion loss of the switches 25. However, other configurations of power measurement are possible.

In the illustrated configuration, the sensed output signal from the directional coupler 24 is provided to the mixer 27, which multiplies the sensed output signal by a reference signal of a controlled frequency. The mixer 27 operates to generate a downshifted signal by downshifting the sensed output signal's frequency content. The downshifted signal can be provided to the ADC 28, which can convert the downshifted signal to a digital format suitable for processing by the baseband processor 21.

By including a feedback path between the output of the power amplifier 23 and the baseband processor 21, the baseband processor 21 can be configured to dynamically adjust the I and Q signals to optimize the operation of the power amplifier system 30. For example, configuring the power amplifier system 30 in this manner can aid in controlling the PAE and/or linearity of the power amplifier 23. However, other implementations of power control can be used.

The power amplifier system 30 illustrates another example of an RF system that can include a power amplifier implemented in accordance with one or more features of the present disclosure.

Figure 3A:
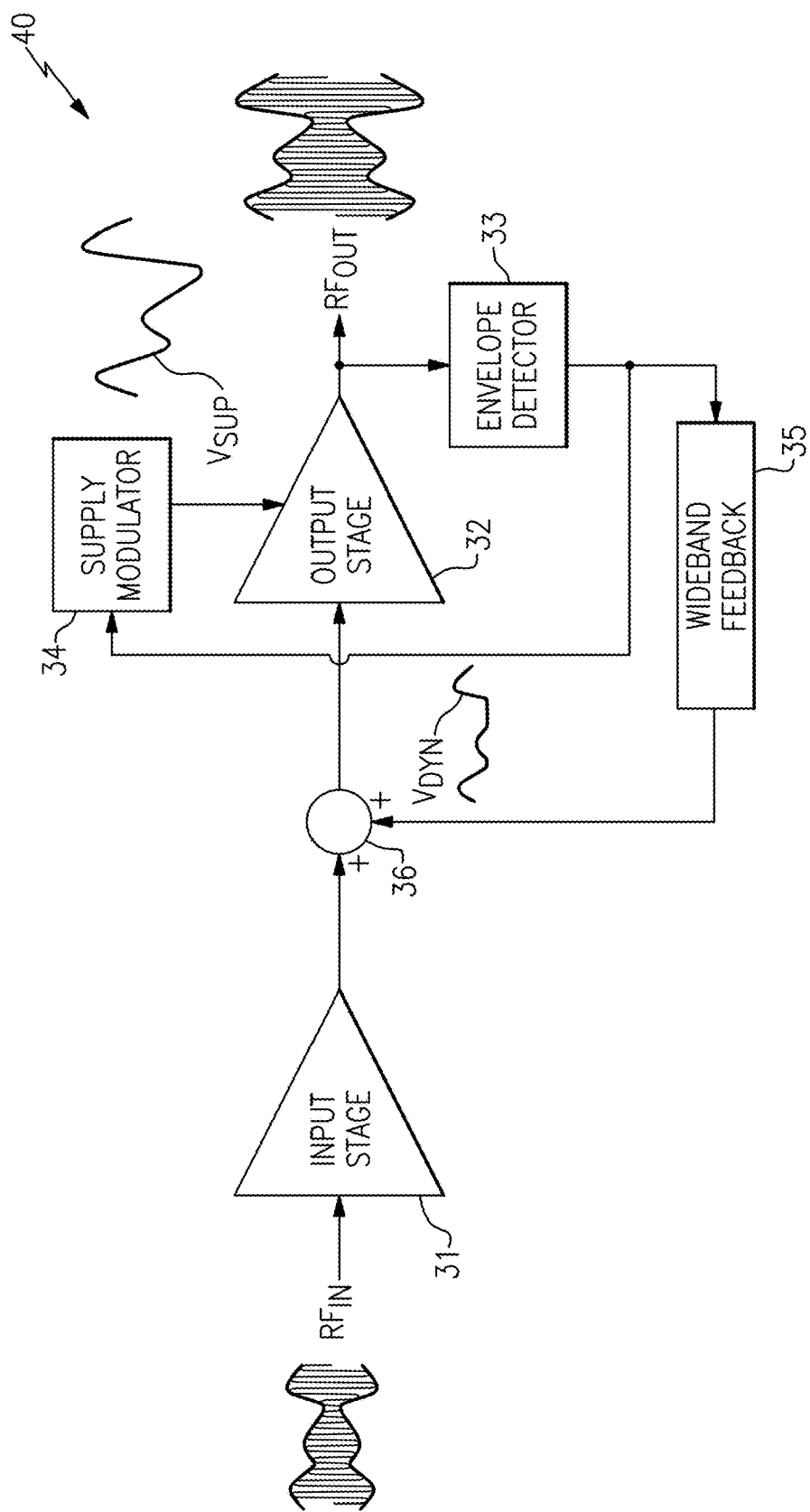
FIG. 3A is a schematic diagram of a power amplifier system with positive envelope feedback according to one embodiment.

FIG. 3A is a schematic diagram of a power amplifier system 40 with positive envelope feedback according to one embodiment. The power amplifier system 40 includes an input stage 31, an output stage 32, an envelope detector 33, a supply modulator 34, a wideband feedback circuit 35, and a signal combiner or adder 36.

The input stage 31 and the output stage 32 provide amplification to an RF input signal $RF_{IN}$ to generate an RF output signal $RF_{OUT}$. The input stage 31 can also be referred to herein as a driver stage, and the output stage 32 can also be referred to herein as a power stage. The input stage 31 and the output stage 32 can be implemented using a wide variety of transistor types and/or amplifier topologies. Although an example using two power amplification stages is shown, the teachings herein are applicable to power amplifiers using more or fewer stages.

As shown in FIG. 3A, the envelope detector 33 is electrically coupled to an output of the output stage 32. Additionally, the envelope detector 33 generates a detection signal indicating an output signal envelope of the output stage 32. In certain implementations, the envelope detector 33 senses an RF signal level or swing at the output of the output stage 32 and generates a baseband signal that changes in relation to the output signal envelope. The envelope detector 33 can be implemented in a wide variety of ways, such as using any suitable envelope detection circuit.

The wideband feedback circuit 35 receives the detection signal, and generates a positive envelope feedback signal for providing positive envelope feedback to a bias of the output stage 32. In certain implementations, the wideband feedback circuit 35 generates a quiescent bias signal for the output stage 32, which is modulated by the output signal envelope.

The wideband feedback circuit 35 can be implemented in a wide variety of ways. In certain implementations, the wideband feedback circuit 35 is implemented using resistive elements that provide positive envelope feedback over a wide range of frequencies. In one embodiment, the wideband feedback circuit 35 includes a voltage shifter that generates a dynamic voltage $V_{DYN}$ corresponding to a voltage shifted version of the detection signal.

In one embodiment, the loop bandwidth associated with the wideband feedback circuit 35 is much larger than (for example, at least four times) a highest envelope frequency that the power amplifier system 40 is transmitting. Implementing the loop bandwidth in this manner provides dynamic biasing with relatively low distortion. In one example, the power amplifier system 40 transmits a 20 MHz envelope, and the loop bandwidth is at least about 80 MHz. However, other loop bandwidth values are possible, for instance, loop bandwidth values suitable for a particular application and/or implementation.

The signal combiner 36 operates to combine the positive envelope feedback signal from the wideband feedback circuit 35 with the amplified RF signal from the input stage 31. The signal combiner 36 can be implemented in a wide variety of ways. In one embodiment, the signal combiner 36 adds the positive envelope feedback signal to the amplified RF signal from the input stage 31.

The illustrated power amplifier system 40 further includes the supply modulator 34, which controls a voltage level of a supply voltage $V_{SUP}$ of the output stage 32 based on the detection signal through positive envelope feedback. The supply modulator 34 can be implemented in a wide variety of ways, such as using any suitable envelope modulation circuit.

The wideband feedback circuit 35 dynamically controls the output stage's bias based on the output signal envelope of the output stage 32, and the supply modulator 34 operates to modulate the supply voltage $V_{SUP}$ with the output signal envelope.

Accordingly, the output signal envelope is used to provide positive envelope feedback that modifies both the bias and the supply voltage of the output stage 32.

Providing positive envelope feedback in this manner can provide a number of advantages, such as enhanced linearity and/or efficiency.

For example, the power amplifier system 40 can operate with enhanced combined linearity and efficiency over a range of power levels. For instance, when the output stage 32 is transmitting at an instantaneous power level that is higher than the average power level, the positive envelope feedback operates to linearize the output stage 32 and/or enhance the output stage's power-added efficiency (PAE).

Accordingly, the power amplifier system 40 can be used to amplify RF signals with complex modulation formats and/or high PAPR. In one embodiment, the RF input signal $RF_{IN}$ is modulated with a QAM modulation scheme of a level of at least 64. In certain implementations, the RF input signal $RF_{IN}$ corresponds to a 5G NR waveform.

Figure 3B:
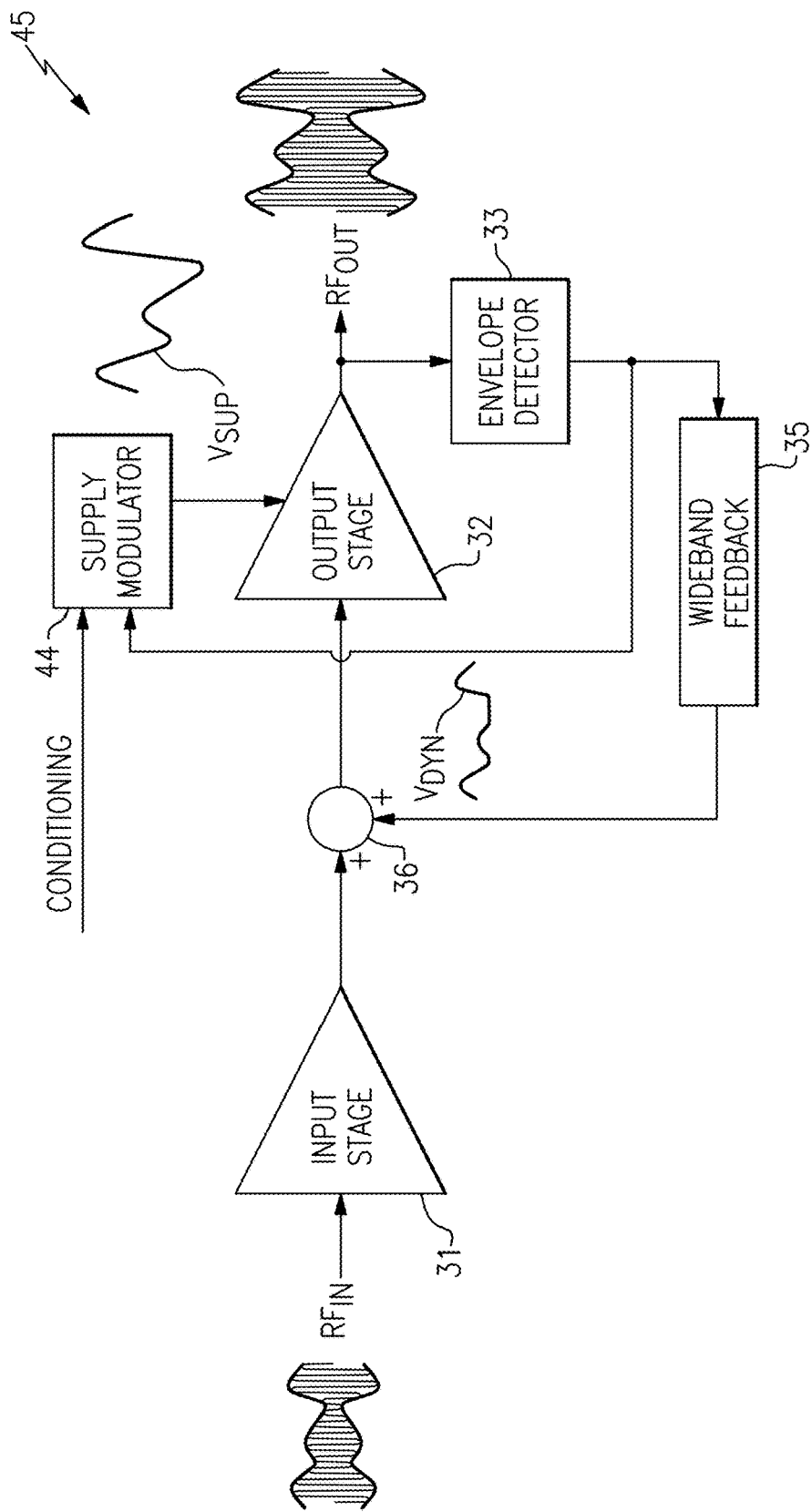
FIG. 3B is a schematic diagram of a power amplifier system with positive envelope feedback according to another embodiment.

FIG. 3B is a schematic diagram of a power amplifier system 45 with positive envelope feedback according to another embodiment. The power amplifier system 45 of FIG. 3B is similar to the power amplifier system 40 of FIG. 3A, except that the power amplifier system 45 includes an implementation of a supply modulator 44 that not only receives the detection signal from the envelope detector 33, but also a conditioning signal (CONDITIONING).

The supply modulator 44 uses the conditioning signal to selectively increase a DC voltage (for instance, a voltage level of a DC supply rail relative to a nominal voltage level) of the supply modulator 45 for large output signal envelopes. The increased DC headroom provided by the increase in DC voltage allows the supply voltage $V_{SUP}$ to follow the output signal envelope (as indicated by the detection signal from the envelope detector 33) with a larger DC headroom even when the output signal envelope is relatively high. Thus, the conditioning signal operates to provide coarse control over the supply voltage $V_{SUP}$, while the detection signal from the envelope detector 33 operates to provide fine control over the supply voltage $V_{SUP}$.

In certain implementations, the supply modulator 44 selectively increases a DC supply rail of the supply modulator 44 based on a correlation with known signal statistics. The conditioning signal can be generated in a wide variety of ways, including, but not limited to, using an input envelope detector, and inter-stage envelope detector, a processor (for instance, a baseband processor), and/or other suitable circuitry.

Figure 3C:
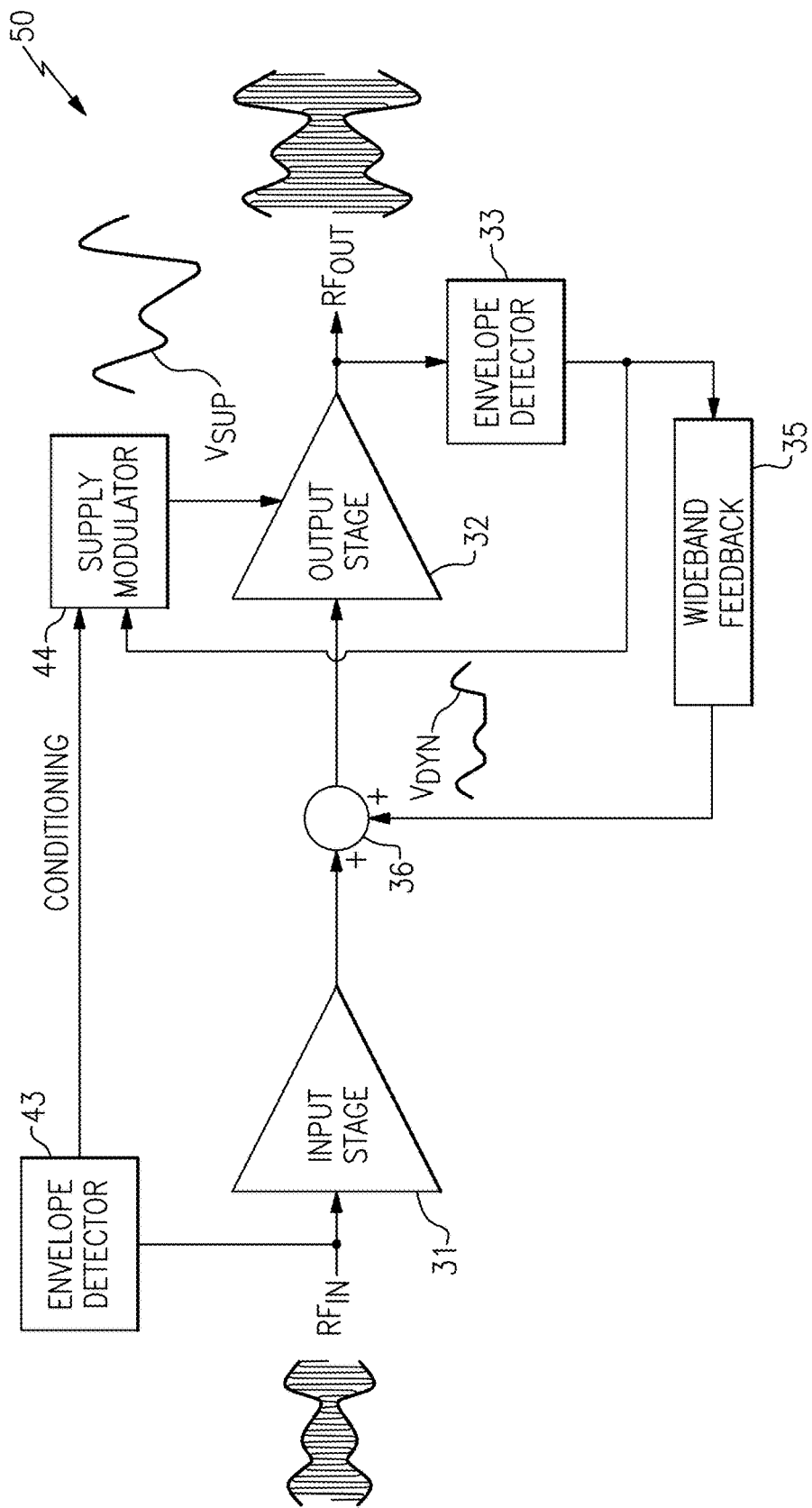
FIG. 3C is a schematic diagram of a power amplifier system with positive envelope feedback according to another embodiment.

FIG. 3C is a schematic diagram of a power amplifier system 50 with positive envelope feedback according to another embodiment. The power amplifier system 50 of FIG. 3C is similar to the power amplifier system 45 of FIG. 3B, except that the power amplifier system 50 of FIG. 3C further includes an input envelope detector 43 for generating the conditioning signal. Although the input envelope detector 43 illustrates one implementation of suitable circuitry for generating the conditioning signal for the supply modulator 44, the conditioning signal can be generated in a wide variety of ways.

Figure 3D:
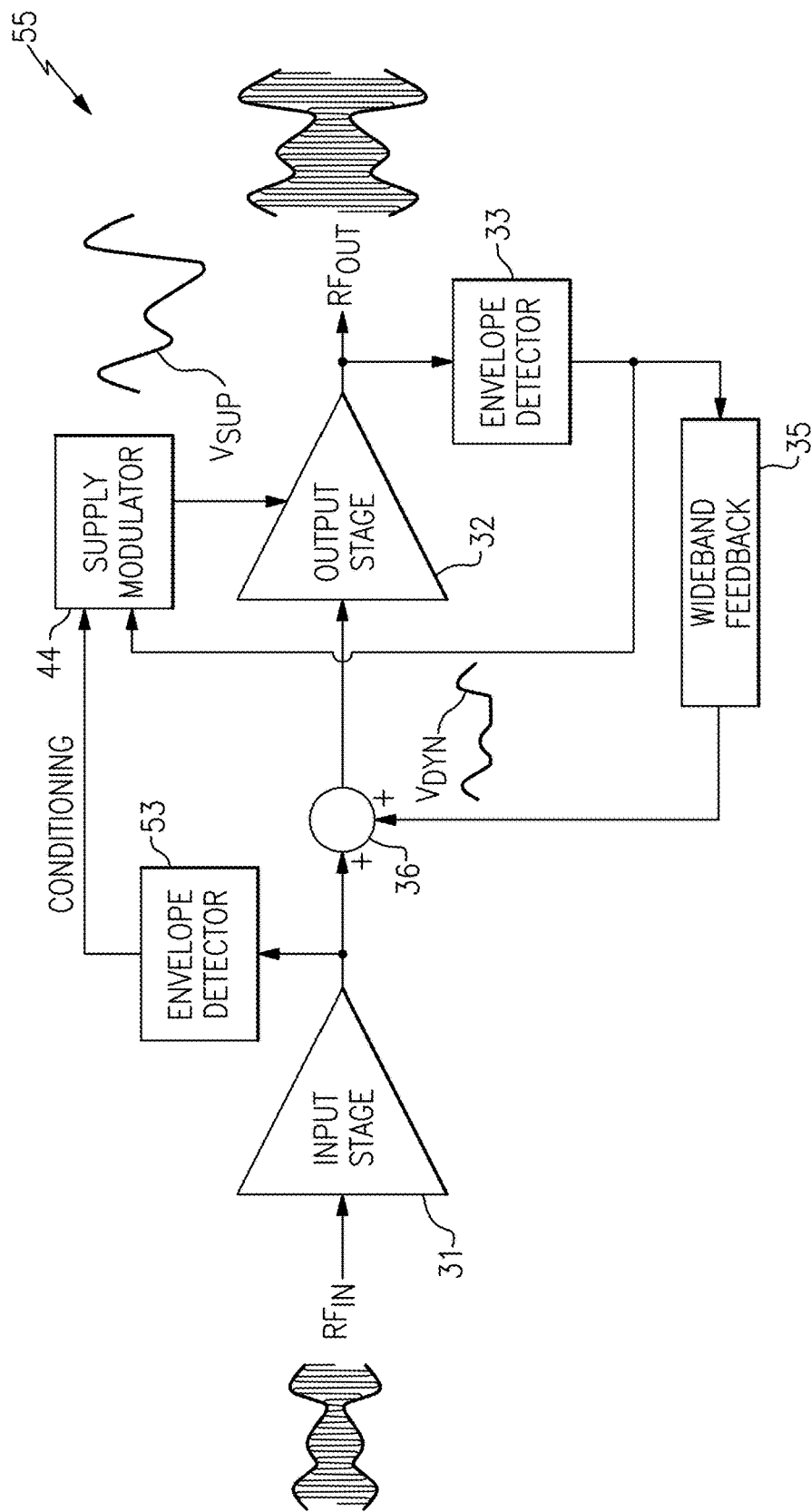
FIG. 3D is a schematic diagram of a power amplifier system with positive envelope feedback according to another embodiment.

FIG. 3D is a schematic diagram of a power amplifier system 55 with positive envelope feedback according to another embodiment. The power amplifier system 55 of FIG. 3D is similar to the power amplifier system 45 of FIG. 3B, except that the power amplifier system 55 of FIG. 3D further includes an inter-stage envelope detector 53 for generating the conditioning signal. The inter-stage envelope detector 53 illustrates another example of suitable circuitry for generating a conditioning signal. However, a conditioning signal for a supply modulator can be generated in a wide variety of ways.

Figure 3E:
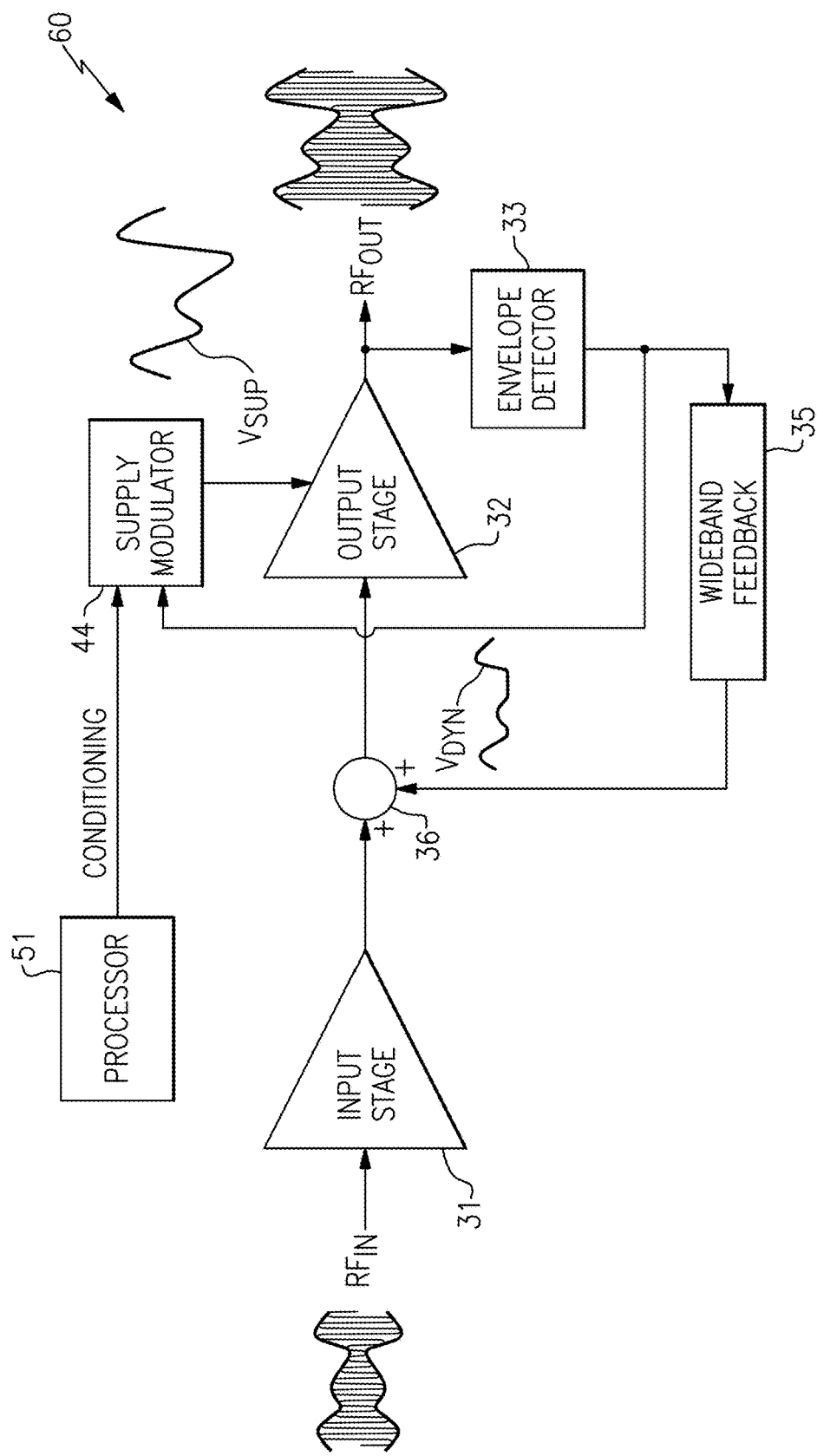
FIG. 3E is a schematic diagram of a power amplifier system with positive envelope feedback according to another embodiment.

FIG. 3E is a schematic diagram of a power amplifier system 60 with positive envelope feedback according to another embodiment. The power amplifier system 60 of FIG. 3E is similar to the power amplifier system 45 of FIG. 3B, except that the power amplifier system 60 of FIG. 3E further includes a processor 51 for generating the conditioning signal. The processor 51 illustrates another example of suitable circuitry for generating a conditioning signal.

In one embodiment, the processor 51 is a baseband processor (for example, the baseband processor 21 of FIG. 2) that also generates I and Q signals digitally representing the RF input signal $RF_{IN}$. In certain implementations, the processor 51 includes an analog-to-digital converter (ADC) used to convert digital conditioning data into an analog conditioning signal suitable for use by the supply modulator 44.

Figure 3F:
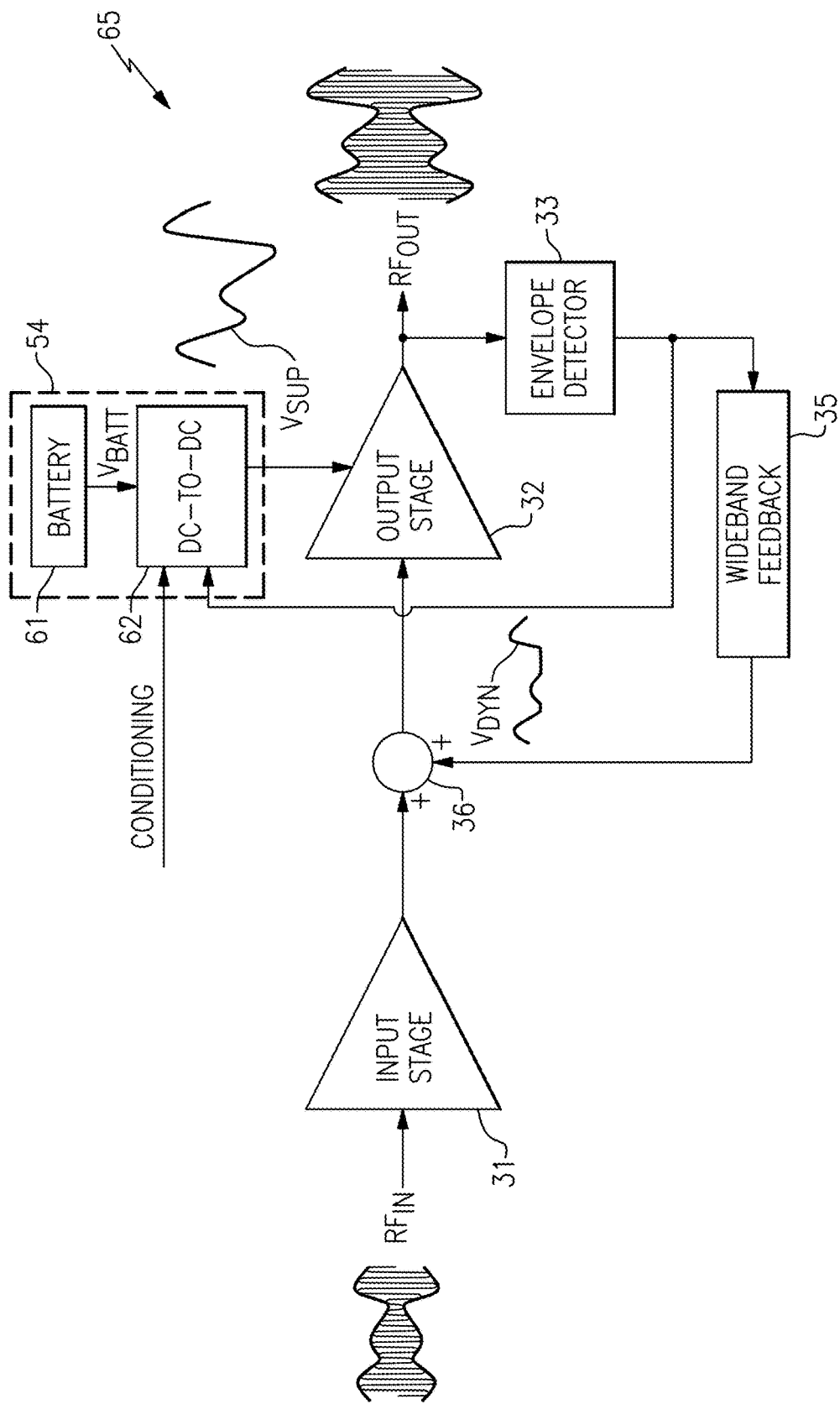
FIG. 3F is a schematic diagram of a power amplifier system with positive envelope feedback according to another embodiment.

FIG. 3F is a schematic diagram of a power amplifier system 65 with positive envelope feedback according to another embodiment. The power amplifier system 65 of FIG. 3F is similar to the power amplifier system 45 of FIG. 3B, except that the power amplifier system 65 illustrates a specific implementation of a supply modulator 54.

In the illustrated embodiment, the supply modulator 54 includes a battery 61 and a DC-to-DC converter 62. As shown in FIG. 3F, the DC-to-DC converter 62 receives a battery voltage $V_{BATT}$ from the battery 61, and generates the supply voltage $V_{SUP}$ by regulating the battery voltage $V_{BATT}$ based on the conditioning signal and the detection signal. In certain implementations, the conditioning signal provides coarse adjustment to regulation of the DC-to-DC converter 62, and the detection signal provides fine adjustment to the regulation of the DC-to-DC converter 62. The DC-to-DC converter 62 can be implemented in a wide variety of ways, including, but not limited to, using a buck converter, a boost converter, and/or a buck-boost converter.

Although FIG. 3F illustrates one implementation of a supply modulator, the power amplifier systems herein can include supply modulators implemented in a wide variety of ways.

Figure 3G:
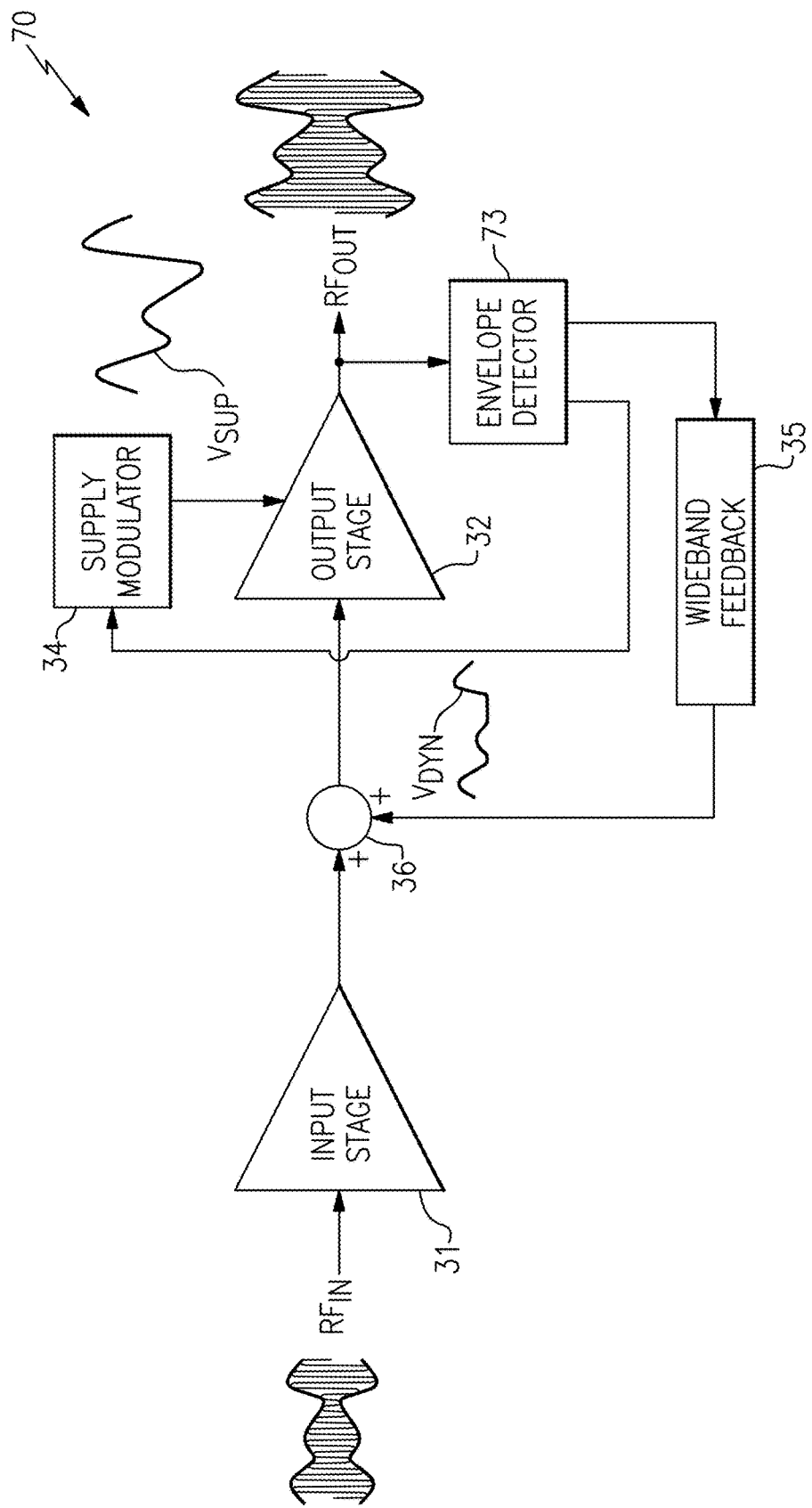
FIG. 3G is a schematic diagram of a power amplifier system with positive envelope feedback according to another embodiment.

FIG. 3G is a schematic diagram of a power amplifier system 70 with positive envelope feedback according to another embodiment. The power amplifier system 70 of FIG. 3G is similar to the power amplifier system 40 of FIG. 3A, except that the power amplifier system 70 includes an envelope detector 73 that generates a first detection signal for the wideband feedback circuit 35 and a second detection signal for the supply modulator 34.

In certain implementations, different amounts and/or types of conditioning (for example, shaping, delay control, scaling, and/or other conditioning) is provided to the first detection signal relative to the second detection signal, thereby helping to provide detection signals suitable for handling by the wideband feedback circuit 35 and the supply modulator 34.

Figure 3H:
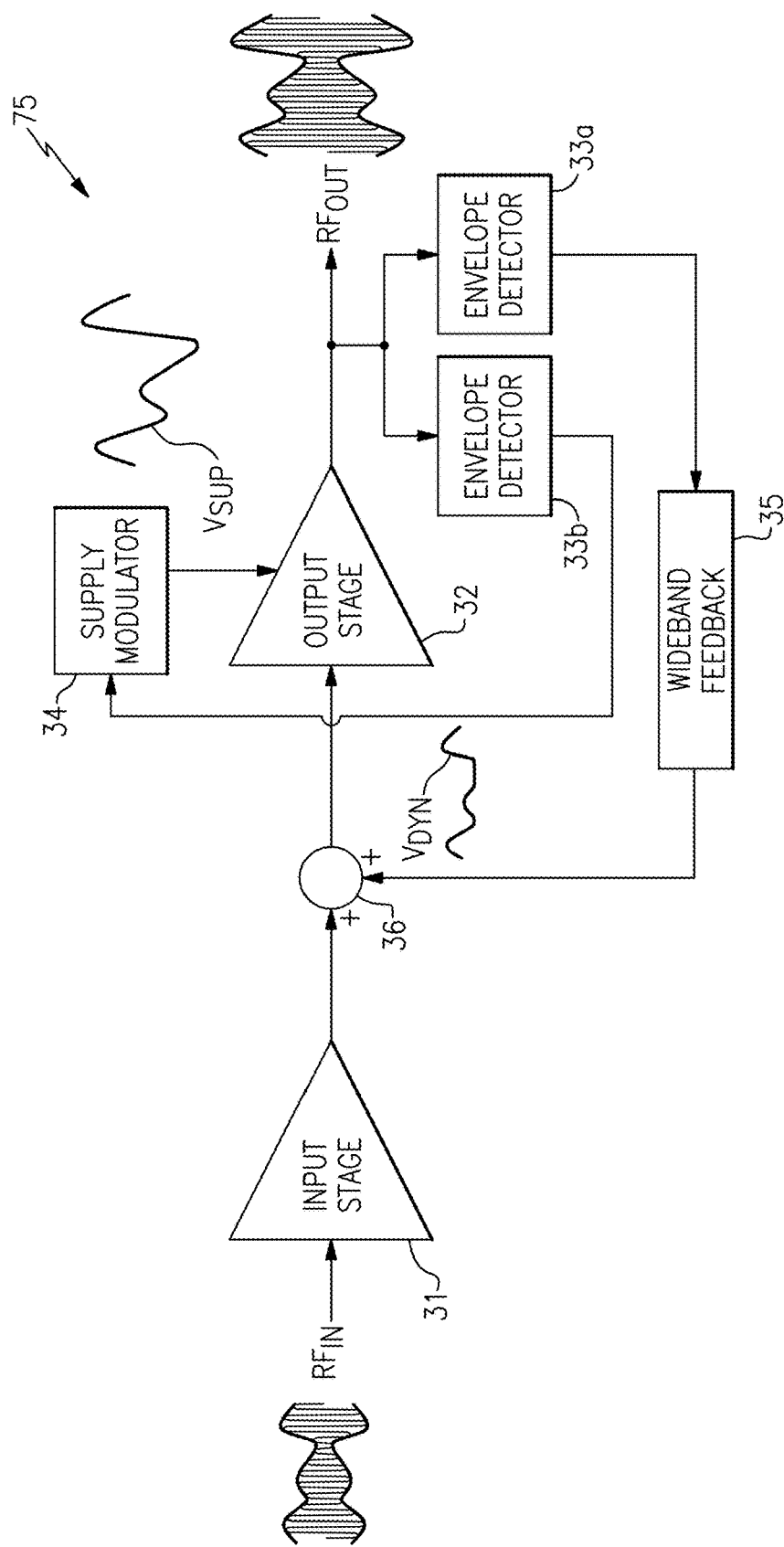
FIG. 3H is a schematic diagram of a power amplifier system with positive envelope feedback according to another embodiment.

FIG. 3H is a schematic diagram of a power amplifier system 75 with positive envelope feedback according to another embodiment. The power amplifier system 75 of FIG. 3H is similar to the power amplifier system 40 of FIG. 3A, except that the power amplifier system 75 includes a first envelope detector 33a that generates a first detection signal for the wideband feedback circuit 35 and a second envelope detector 33b that generates a second detection signal for the supply modulator 34.

In certain implementations, the first envelope detector 33a provides different conditioning relative to the second envelope detector 33b. Implementing the detectors in this manner aids in providing detection signals suitable for handling by the wideband feedback circuit 35 and the supply modulator 34. In one embodiment, the first envelope detector 33a and the second envelope detector 33b provide detection at different points along an RF output signal path. For example, the first envelope detector 33a can provide detection before an output matching network while the second envelope detector 33b can provide detection after the output matching network, or vice versa.

Figure 4A:
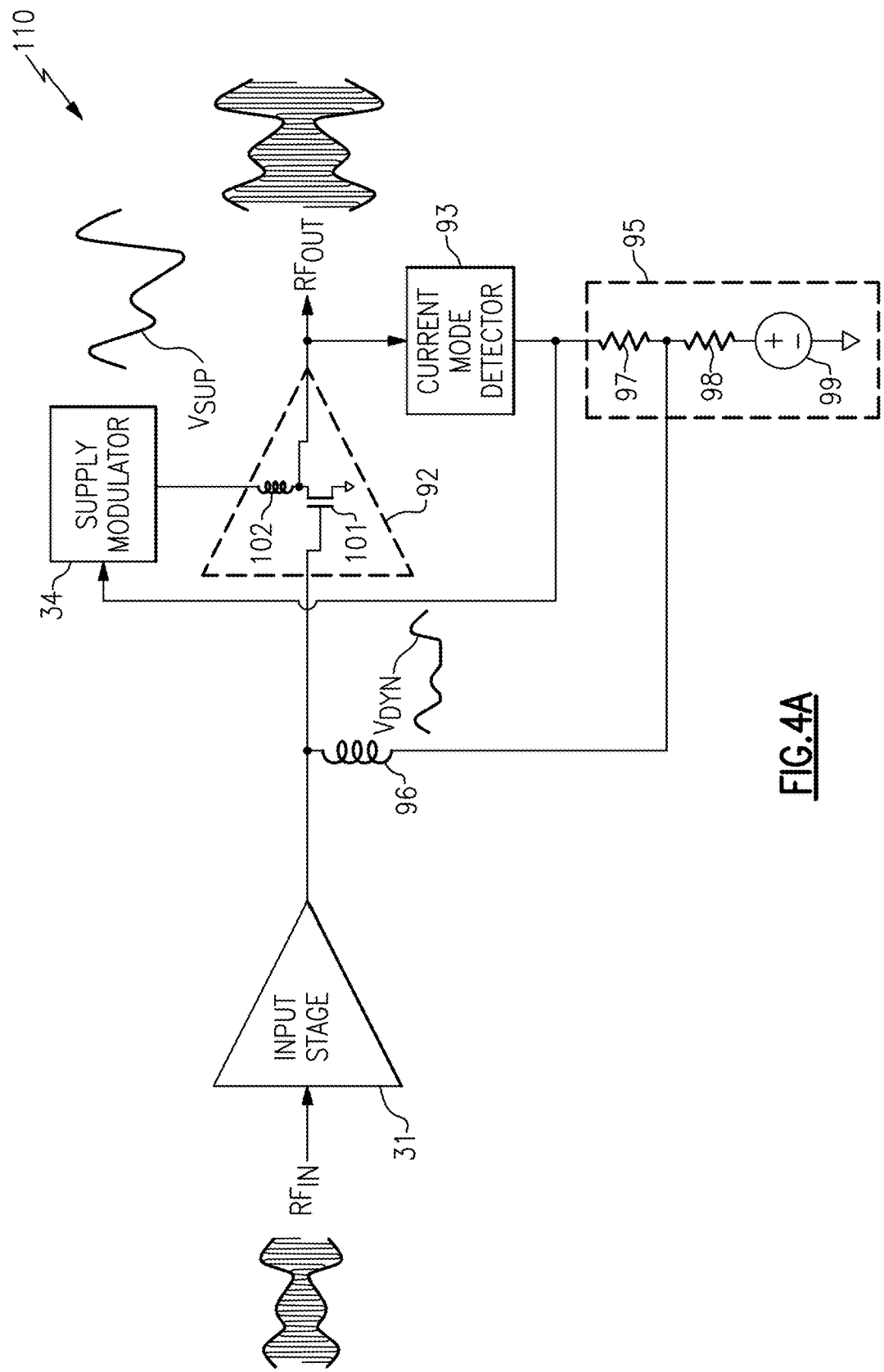
FIG. 4A is a schematic diagram of a power amplifier system with positive envelope feedback according to another embodiment.

FIG. 4A is a schematic diagram of a power amplifier system 110 with positive envelope feedback according to another embodiment. The power amplifier system 110 includes an input stage 31, an output stage 92, a current mode detector 93, a supply modulator 34, a wideband resistive voltage shifter 95, and a bias choke inductor 96.

The power amplifier system 110 of FIG. 4A is similar to the power amplifier system 40 of FIG. 3A, except that the power amplifier system 110 illustrates specific implementations of the output stage, the envelope detector, the wideband feedback circuit, and the signal combiner of FIG. 3A.

The output stage 92 includes a field-effect transistor 101 and a supply choke inductor 102. The field-effect transistor 101 includes a gate that receives the amplified RF signal from the input stage 31 and that is biased by the wideband resistive voltage shifter 95. The field-effect transistor 101 further includes a source electrically connected to ground, and a drain that generates the RF output signal $RF_{OUT}$ and that receives the supply voltage $V_{SUP}$ via the supply choke inductor 102. The supply choke inductor 102 aids in powering the output stage 92 with the supply voltage $V_{SUP}$, while providing impedance sufficient to block the RF output signal $RF_{OUT}$. In one embodiment, the field-effect transistor 101 is fabricated by a silicon on insulator (SOI) processing technology.

Although the illustrated power amplifier system 110 includes two stages, other configurations are possible, including, for example, power amplifiers including one stage or three or more stages. Although the illustrated output stage 92 is implemented using a field-effect transistor, the teachings herein are also applicable to configurations using bipolar transistor configurations or a combination of field-effect and bipolar transistors. Furthermore, other amplifier topologies can be used, including, but not limited to, cascode topologies. For example, a cascode power amplifier stage can include a common source transistor or common emitter transistor in series with one or more cascode transistors.

The current mode detector 93 generates a detection signal based on providing RF to DC conversion gain. For example, the current mode detector 93 can be used to extract the output signal envelope of the output stage 92 based on the amount of drain current of the field-effect transistor 101. Additionally, the current mode detector 93 generates an output voltage that changes in relation to the output signal envelope.

The wideband resistive voltage shifter 95 includes a first resistor 97, a second resistor 98, and a voltage source 99. The voltage source 99 controls a quiescent bias voltage of the gate of the field-effect transistor 101 when the output of the current mode detector 93 is low.

Additionally, the first and second resistors 97, 98 operate as a voltage divider that provides positive envelope feedback to the gate of the field-effect transistor 101 based on the output signal envelope detected by the current mode detector 93. For example, an intermediate node between the first and second resistors 97, 98 is used to generate a positive envelope feedback signal that is provided to an input of output stage 92 via the bias choke inductor 96.

In certain implementations, a resistance of at least one of the first resistor 97 or the second resistor 98 is controllable (for instance, variable or programmable) based on a control signal. For instance, the resistance ratio of the first resistor 97 and the second resistor 98 can be controlled to achieve a desired amount of voltage shifting from the output of the current mode detector 93 to the input of the output stage 92. Although one implementation of a wideband feedback circuit has been shown in FIG. 4A, a wideband feedback circuit can be implemented in other ways.

Figure 4B:
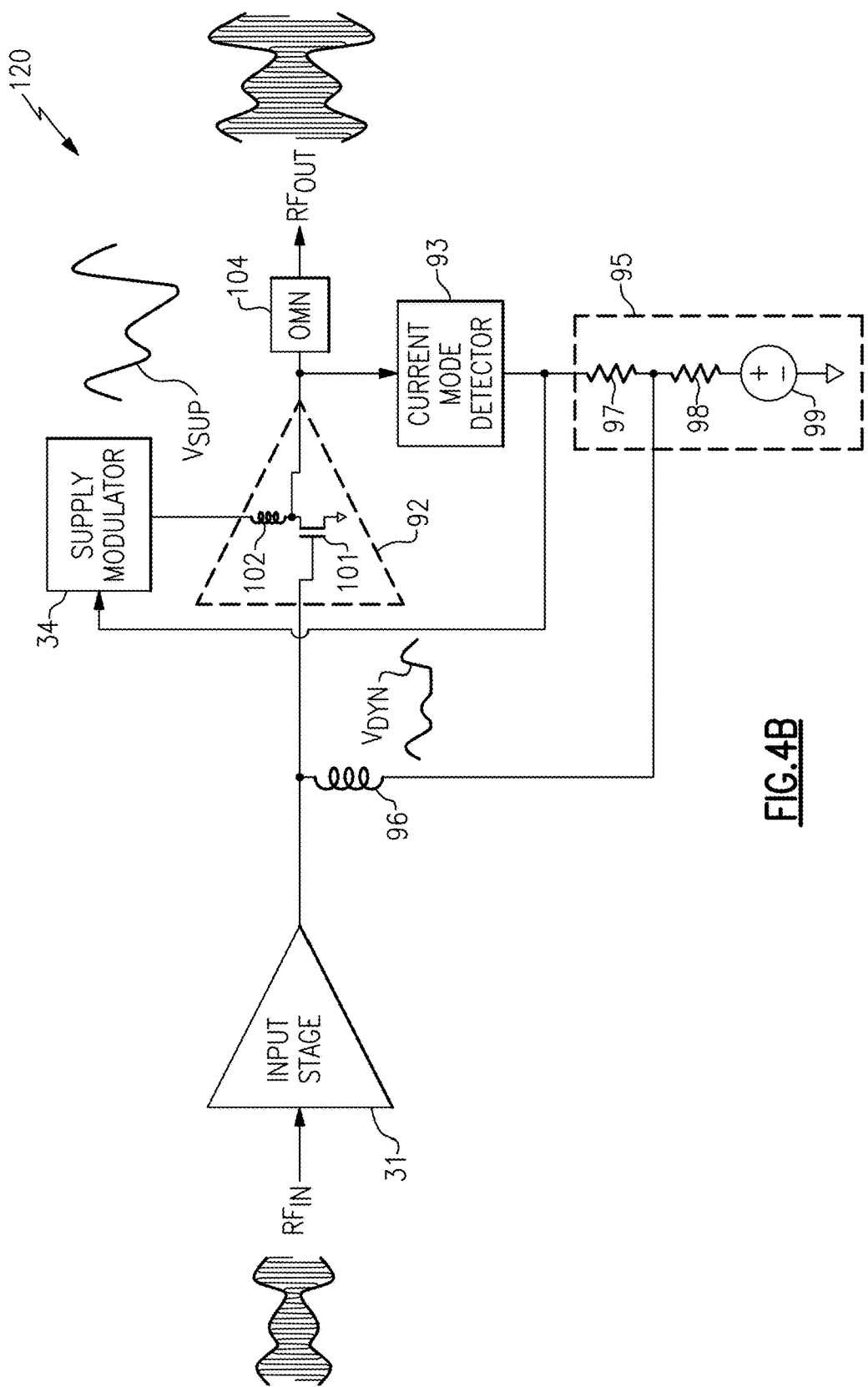
FIG. 4B is a schematic diagram of a power amplifier system with positive envelope feedback according to another embodiment.

FIG. 4B is a schematic diagram of a power amplifier system 120 with positive envelope feedback according to another embodiment. The power amplifier system 120 of FIG. 4B is similar to the power amplifier system 110 of FIG. 4A, except that the power amplifier system 120 includes an output matching network 104. In the illustrated embodiment, the current mode detector 93 provides detection before the output matching network 104. An envelope detector can provide detection at a wide variety of positions along an output signal path of a power amplifier.

Figure 4C:
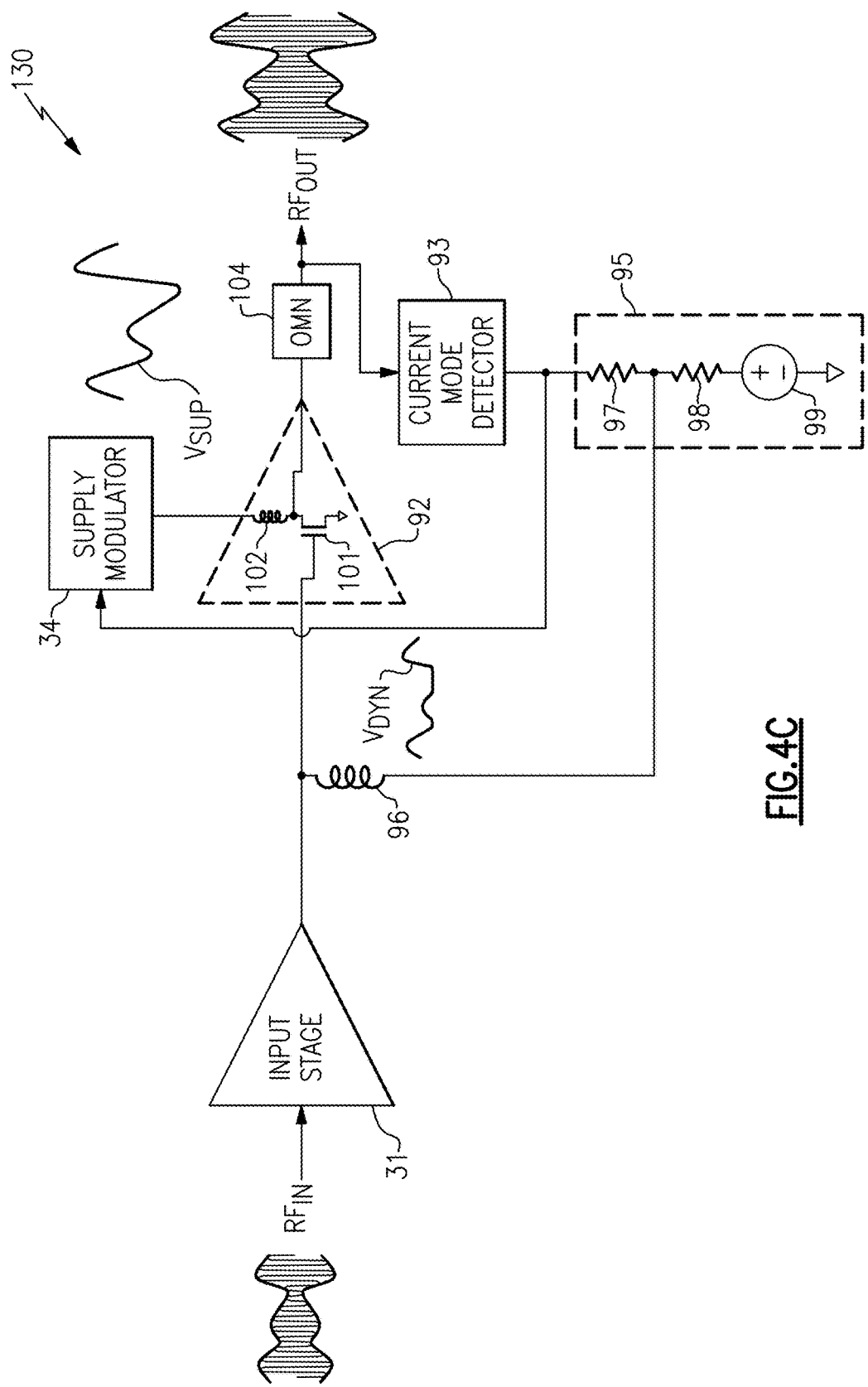
FIG. 4C is a schematic diagram of a power amplifier system with positive envelope feedback according to another embodiment.

FIG. 4C is a schematic diagram of a power amplifier system 130 with positive envelope feedback according to another embodiment. The power amplifier system 130 of FIG. 4C is similar to the power amplifier system 110 of FIG. 4A, except that the power amplifier system 130 includes an output matching network 104. In the illustrated embodiment, the current mode detector 93 provides detection after the output matching network 104.

Figure 5:
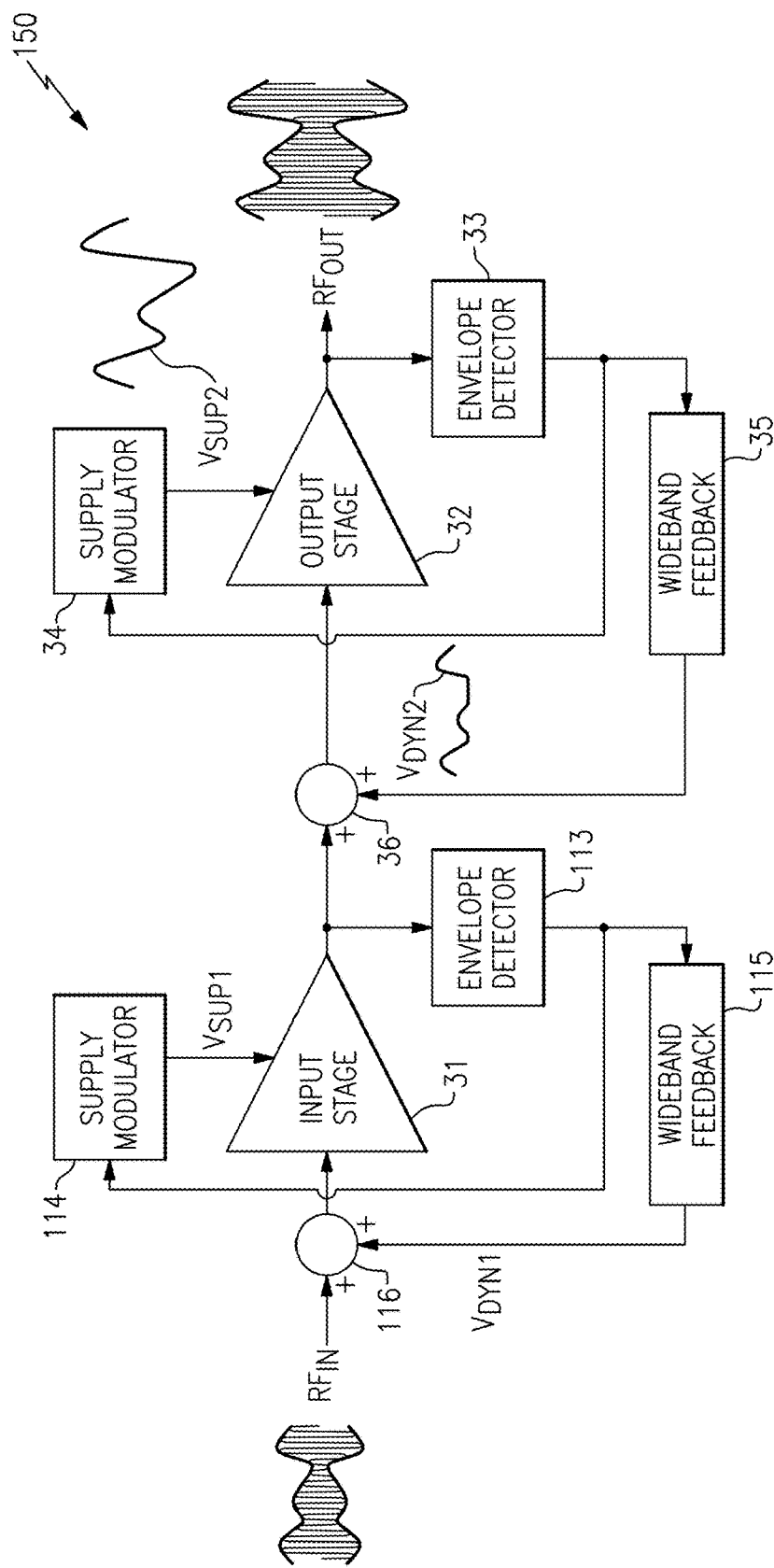
FIG. 5 is a schematic diagram of a power amplifier system with positive envelope feedback according to another embodiment.

FIG. 5 is a schematic diagram of a power amplifier system 150 with positive envelope feedback according to another embodiment. The power amplifier system 150 of FIG. 5 is similar to the power amplifier system 40 of FIG. 3A, except that the power amplifier system 150 further includes an input stage envelope detector 113, an input stage supply modulator 114, an input stage wideband feedback circuit 115, and an input stage signal combiner 116.

The power amplifier system 150 illustrates one example of a power amplifier system in which positive envelope feedback is used for multiple stages. For example, by providing multiple positive envelope feedback loops, further enhancements in power amplifier linearity and/or efficiency can be achieved.

Figure 6A:
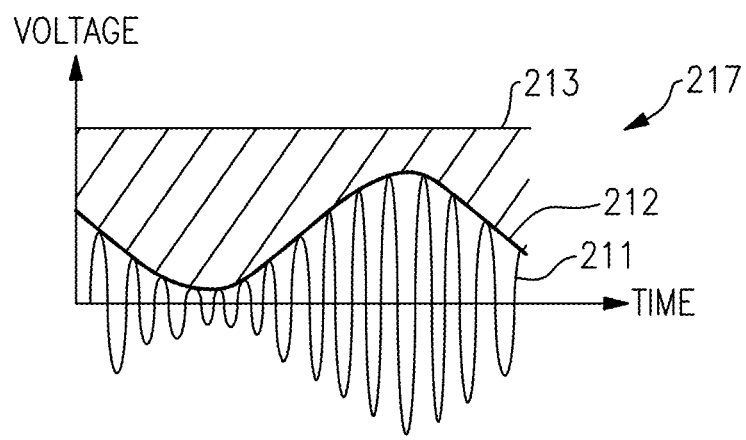
FIG. 6A is a graph showing a first example of power amplifier supply voltage versus time.

FIG. 6A is a graph 217 showing a first example of power amplifier supply voltage versus time. The graph 217 illustrates the voltage of an RF output signal 211 from a power amplifier, the RF output signal's envelope 212, and a power amplifier supply voltage 213 versus time. The graph 217 corresponds to one example of waveforms for an implementation in which the power amplifier supply voltage 213 is substantially fixed.

Figure 6B:
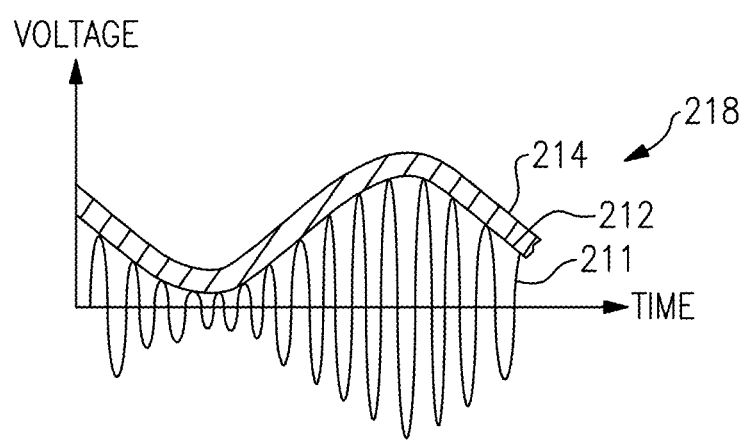
FIG. 6B is a graph showing a second example of power amplifier supply voltage versus time.

FIG. 6B is a graph 218 showing a second example of power amplifier supply voltage versus time. The graph 218 illustrates the voltage of an RF output signal 211, the RF output signal's envelope 212, and a power amplifier supply voltage 214 versus time. The graph 218 corresponds to one example of waveforms for an implementation in which positive envelope feedback is used to modulate the power amplifier supply voltage 214.

In contrast to the power amplifier supply voltage 213 of FIG. 6A, the power amplifier supply voltage 214 of FIG. 6B changes in relation to the envelope 212 of the RF output signal 211. The power amplifier supply voltage 214 of FIG.

6B illustrates one example of a power amplifier supply voltage modulated by an output envelope 212 of a power amplifier.

Figure 7A:
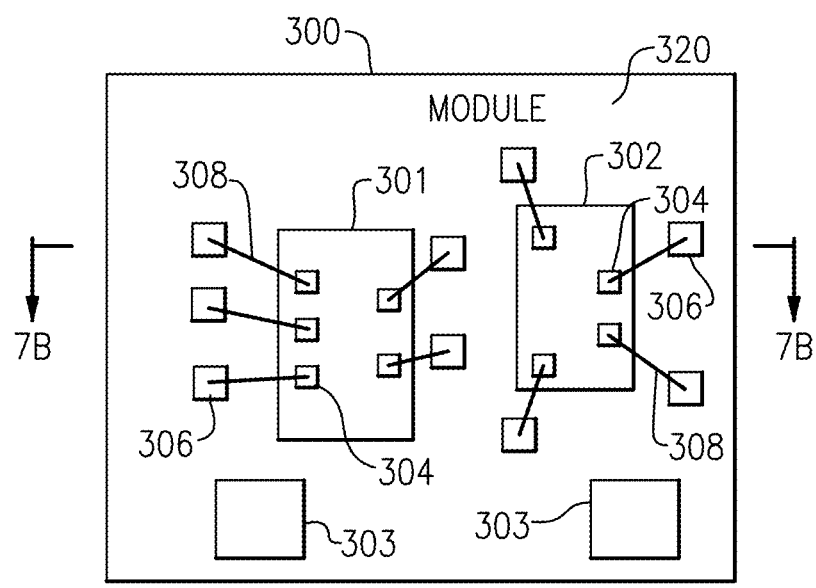
FIG. 7A is a schematic diagram of one embodiment of a packaged module.
Figure 7B:
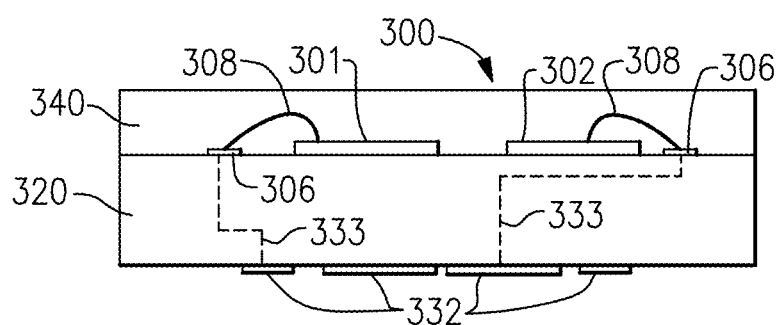
FIG. 7B is a schematic diagram of a cross-section of the packaged module of FIG. 7A taken along the lines 7B-7B.

FIG. 7A is a schematic diagram of one embodiment of a packaged module 300. FIG. 7B is a schematic diagram of a cross-section of the packaged module 300 of FIG. 7A taken along the lines 7B-7B.

The packaged module 300 includes a power amplifier die 301, a modulator die 302, surface mount components 303, wirebonds 308, a package substrate 320, and encapsulation structure 340.

The packaging substrate 320 is configured to receive a plurality of components, such as the dies 301, 302 and the surface mount components 303. Additionally, the package substrate 320 includes pads 306 formed from conductors disposed therein. As shown in FIGS. 7A and 7B, the dies 301, 302 include pads 304, and the wirebonds 308 have been used to connect the pads 304 of the dies 301, 302 to the pads 306 of the package substrate 301.

The packaged module 300 is implemented in accordance with one or more features of the present disclosure.

For example, in one embodiment, the power amplifier die 301 includes an envelope detector (for instance, the envelope detector 33), a wideband feedback circuit (for instance, the wideband feedback circuit 35), and a power amplification stage (for instance, the output stage 32), and the modulator die 302 includes a supply modulator (for instance, the supply modulator 34). In certain implementations, one or more choke inductors (for instance, the bias choke inductor 96 and/or the supply choke inductor 102) are implemented as surface mount components 303 on the package substrate 320.

In certain implementations, the dies 301, 302 are manufactured using different processing technologies.

The packaged module 300 implements a power amplifier system with positive envelope feedback in a single multi-chip module (MCM), thereby providing a relatively compact solution. In contrast, certain power amplifier systems that operate with envelope tracking are implemented using a power amplifier module and a separate envelope tracker module that provides a power amplifier supply voltage to a pin of the power amplifier module.

As shown in FIG. 7B, the packaged module 300 includes a plurality of contact pads disposed on the side of the packaged module 300 opposite the side used to mount the dies 301, 302. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the dies 301, 302 and/or the surface mount components 303. As shown in FIG. 7B, the electrical connections between the contact pads 332 and the dies 301, 302 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Applications

Some of the embodiments described above have provided examples in connection with wireless devices or mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
   a power amplification stage configured to amplify a radio frequency signal;
   at least one output envelope detector configured to generate one or more detection signals indicating an output signal envelope of the power amplification stage;
   a feedback circuit configured to provide positive envelope feedback to a bias of the power amplification stage based on the one or more detection signals; and
   a supply modulator configured to control a voltage level of a supply voltage of the power amplification stage based on the one or more detection signals such that the supply voltage is modulated with the output signal envelope through positive envelope feedback, the supply modulator configured to provide a coarse adjustment to the voltage level based on a conditioning signal and to provide a fine adjustment to the voltage level based on the one or more detection signals.

2. The power amplifier system of claim 1 wherein the at least one output envelope detector includes a current mode detector electrically coupled to an output of the power amplification stage.

3. The power amplifier system of claim 1 wherein the feedback circuit includes a wideband voltage shifter.

4. The power amplifier system of claim 3 wherein the wideband voltage shifter includes a first resistor including a first end configured to receive a first detection signal of the one or more detection signals and a second end configured to generate a positive envelope feedback signal operable to control the bias of the power amplification stage.

5. The power amplifier system of claim 4 wherein the wideband voltage shifter further includes a voltage source and a second resistor electrically connected between the second end of the first resistor and the voltage source, the first resistor and the second resistor configured to operate as a voltage divider.

6. The power amplifier system of claim 1 wherein the power amplification stage includes a field-effect transistor configured to amplify the radio frequency signal, the feedback circuit configured to provide positive envelope feedback to a gate of the field-effect transistor based on the one or more detection signals.

7. A packaged module comprising:
   a package substrate;
   a first die attached to the package substrate and including a power amplification stage configured to amplify a radio frequency signal, at least one output envelope detector configured to generate one or more detection signals indicating an output signal envelope of the power amplification stage, and a feedback circuit configured to provide positive envelope feedback to a bias of the power amplification stage based on the one or more detection signals; and
   a second die attached to the package substrate and including a supply modulator configured to control a voltage level of a supply voltage of the power amplification stage based on the one or more detection signals such that the supply voltage is modulated with the output signal envelope through positive envelope feedback, the supply modulator configured to provide a coarse adjustment to the voltage level based on a conditioning signal and to provide a fine adjustment to the voltage level based on the one or more detection signals.

8. The packaged module of claim 7 wherein the at least one output envelope detector includes a current mode detector electrically coupled to an output of the power amplification stage.

9. The packaged module of claim 7 wherein the feedback circuit includes a wideband voltage shifter.

10. The packaged module of claim 9 wherein the wideband voltage shifter includes a first resistor including a first end configured to receive a first detection signal of the one or more detection signals and a second end configured to generate a positive envelope feedback signal operable to control the bias of the power amplification stage.

11. The packaged module of claim 10 wherein the wideband voltage shifter further includes a voltage source and a second resistor electrically connected between the second end of the first resistor and the voltage source, the first resistor and the second resistor configured to operate as a voltage divider.

12. The packaged module of claim 7 wherein the power amplification stage includes a field-effect transistor configured to amplify the radio frequency signal, the feedback circuit configured to provide positive envelope feedback to a gate of the field-effect transistor based on the one or more detection signals.

13. A method of amplification in a power amplifier system, the method comprising:
   amplifying a radio frequency signal using a power amplification stage;
   generating one or more detection signals indicating an output signal envelope of the power amplification stage using at least one output envelope detector;
   providing positive envelope feedback to a bias of the power amplification stage based on the one or more detection signals using a feedback circuit; and controlling a voltage level of a supply voltage of the power amplification stage based on the one or more detection signals using a supply modulator so as to modulate the supply voltage with the output signal envelope through positive envelope feedback including providing a coarse adjustment to the voltage level based on a conditioning signal and providing a fine adjustment to the voltage level based on the one or more detection signals.

14. The method of claim 13 wherein providing positive envelope feedback to the bias of the power amplification stage includes controlling a gate bias of a field effect transistor of the power amplification stage.

15. The method of claim 13 wherein generating the one or more detection signals includes extracting the output signal envelope from an output of the power amplification stage using a current mode detector.

16. The method of claim 13 wherein providing positive envelope feedback to the bias of the power amplification stage includes receiving a first detection signal of the one or more detection signals at a first end of a first resistor, and generating a positive envelope feedback signal operable to control the bias of the power amplification stage at a second end of the first resistor.

17. The method of claim 16 wherein providing positive envelope feedback to the bias of the power amplification stage further includes operating the first resistor and a second resistor as a voltage divider.

18. The power amplifier system of claim 1 further comprising an input envelope detector configured to generate the conditioning signal.

19. The power amplifier system of claim 1 further comprising an inter-stage envelope detector configured to generate the conditioning signal.

20. The power amplifier system of claim 1 further comprising a processor configured to generate the conditioning signal.

* * * * *